US012658881B2

(12) United States Patent
Mitsuhashi

(10) Patent No.: US 12,658,881 B2
(45) Date of Patent: Jun. 16, 2026

(54) INTEGRATION OF CARBON NANOTUBES IN PACKAGE FILLER AND GEL OVERCOAT

(71) Applicant: SKYWORKS SOLUTIONS, INC., Irvine, CA (US)

(72) Inventor: Akio Mitsuhashi, Yao (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 881 days.

(21) Appl. No.: 17/943,500

(22) Filed: Sep. 13, 2022

(65) Prior Publication Data

US 2023/0081433 A1     Mar. 16, 2023

Related U.S. Application Data

(60) Provisional application No. 63/244,844, filed on Sep. 16, 2021.

(51) Int. Cl.
| | |
|---|---|
| *H03H 9/02* | (2006.01) |
| *H03H 3/08* | (2006.01) |
| *H03H 9/10* | (2006.01) |

(52) U.S. Cl.
CPC .......... *H03H 9/02913* (2013.01); *H03H 3/08* (2013.01); *H03H 9/1085* (2013.01)

(58) Field of Classification Search
CPC .... H03H 9/02913; H03H 9/1085; H03H 9/05; H03H 9/0538; H03H 9/058; H03H 9/10
USPC ...... 310/313 R, 313 A, 313 B, 313 C, 313 D
See application file for complete search history.

(56) References Cited

U.S. PATENT DOCUMENTS 6,663,943 B2 *  12/2003  Kadota ................ H03H 9/1085
                                                              257/788
2020/0076402 A1    3/2020   Koo et al.

* cited by examiner

*Primary Examiner* — Derek J Rosenau
(74) *Attorney, Agent, or Firm* — Lando & Anastasi, LLP

(57) ABSTRACT

An electronic component enclosed in a protective packaging, the protective packaging comprises a gel material and an electrically conductive filler material. The electrically conductive filler material is mixed into the gel material for formulating a package filler. The package filler is configured to form a protective layer over the electronic component for attenuating at least part of an electromagnetic wave input to the electronic component according to input wave strength.

20 Claims, 16 Drawing Sheets

1000

1000

1300

1340        1302        1340

1300

1340        1350    1302        1340

1300

1340

1350

1341

1340

INTEGRATION OF CARBON NANOTUBES IN PACKAGE FILLER AND GEL OVERCOAT

CROSS-REFERENCE TO RELATED APPLICATIONS

This application claims priority under 35 U.S.C. § 119(e) to U.S. Provisional Patent Application Ser. No. 63/244,844, titled "INTEGRATION OF CARBON NANOTUBES IN PACKAGE FILLER AND GEL OVERCOAT," filed Sep. 16, 2021, the entire contents of which is incorporated herein in its entirety for all purposes.

BACKGROUND

Field

Aspects and embodiments disclosed herein relate to an electronic components enclosed in protective packaging and to methods for manufacturing protective packaging for electronic components.

Description of the Related Technology

Electronic components or devices, such as surface acoustic wave (SAW) devices, can be packaged within an enclosed packaging structure to protect the surface acoustic wave device. Conventional packaging is intended to offer protection from environmental factors (mechanical shock, humidity, dust, scratching, gases, etc.) that might affect the functionality of the device. However, conventional packaging structures typically provide little or no protection against high-strength incoming electromagnetic waves that may be input to the electronic components and that can damage the electric components. The electromagnetic waves of interest in this disclosure include radio waves with a frequency range of 700 MHz to 1500 MHz, which may be the range of operating frequencies for a typical SAW device. In other implementations, different frequencies may be chosen.

One example of a protective packaging structure for a SAW device is illustrated in cross-sectional view in FIG. 1. The SAW device includes a die 102 and interdigital transducer electrodes (IDTs) 104 on the die 102. The IDTs are disposed within a cavity 116. The sides of the cavity 116 are formed by cavity walls 112, and the roof of the cavity 116 is formed by a cavity roof 114 supported by the cavity walls 112 and extending over the IDTs 104. A conductive layer 122 covers the cavity roof 114. The conductive layer 122 extends along the sides of the cavity walls 112, and down to the die 102, where the conductive layer 122 can contact interconnect structures such as electronic traces on the die 102, allowing electrical communication with the IDTs 104. An insulation layer 132 extends over the outer surfaces of the conductive layer 122, acting as a buffer coat layer. The insulation layer 132 extends down the sides of the conductive layer 122 to the die 102.

This packaging structure of SAW device has no adjusting or attenuating effect on incoming electromagnetic waves.

SUMMARY

According to one embodiment, there is provided an electronic component enclosed in a protective packaging. The protective packaging comprises a gel material and an electrically conductive filler material which is mixed into the gel material for formulating a package filler. The package filler is configured to form a protective layer over the electronic component for attenuating at least part of an electromagnetic wave input to the electronic component according to input wave strength.

In one example, the electronic component is a surface acoustic wave (SAW) device.

In one example, the packaging comprises a protective layer which is deposited on the outer surface of a cavity covering functional units of the SAW device.

In one example, the protective layer comprises PMMA as the gel material and carbon nanotubes as the electrically conductive filter material which is mixed into the PMMA gel material.

In one example, the protective layer is deposited directly on the functional units of the SAW device.

In one example, the protective layer is deposited on top of a multi-layer packaged SAW device wherein the packaging comprises a conductive layer.

In one example, the protective layer is deposited on top of a multi-layer packaged SAW device wherein the packaging comprises both a conductive layer and an insulating layer.

In one example, the packaging of SAW device further comprises a seal layer on top of the protective layer.

According to another embodiment, there is provided a package filler for packaging an electronic component. The package filler comprises a gel material and an electrically conductive filler material which is mixed into the gel material for forming a package filler. The package filler is configured to form a protective layer of the electronic component for attenuating at least part of an electromagnetic wave input to the electronic component according to input wave strength.

In one example, the electronic component is a SAW device.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment," or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments and are incorporated in and constitute a part of this specification but are not intended as a definition of the limits of the aspects and embodiments disclosed herein. In the figures, each identical or nearly identical component that is illustrated in various figures is represented by a like numeral. For purposes of clarity, not every component may be labeled in every figure. In the figures.

DETAILED DESCRIPTION

Figure 1:
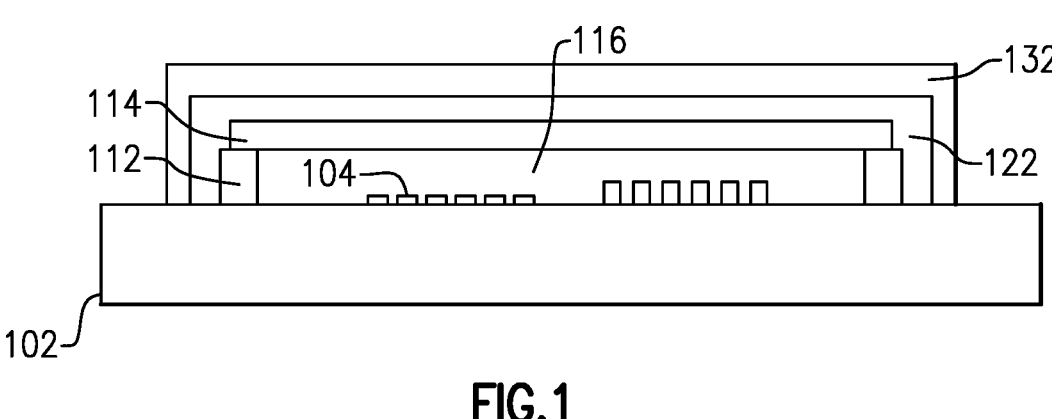
FIG. 1 is a cross-sectional view of an exemplary packaged SAW device.

Aspects and embodiments described herein are directed to electronic components enclosed in protective packaging, package filler for packaging the electronic components, and to methods for packaging the electronic components. In accordance with various aspects and embodiments disclosed herein an electronic component is enclosed in a protective packaging. The protective packaging comprises a gel material, an electrically conductive filler material which is mixed into the gel material for formulating a package filler, and a seal layer configured to secure the package filler. The package filler is configured to form a protective layer of the packaging for shielding/absorbing at least part of an electromagnetic wave input to the electronic component.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

An electronic component enclosed in a protective packaging to adjust a strength of an input electromagnetic wave (EM wave) and a method to manufacture the protective packaging are disclosed. The electronic component may be a surface acoustic wave (SAW) device according to some embodiments, or a bulk acoustic wave (BAW) device. Some highly conductive materials, such as carbon nanotubes (CNTs), graphene, and metal particles, have a shielding or absorption effect in response to incidence of electromagnetic waves (e.g., radio waves). Adding these conductive materials into a gel material forms material that may be utilized as a protective layer in a packaging structure for an electronic component. The addition of conductive filler materials can therefore screen out or attenuate at least part of any incident high-strength electromagnetic waves (such as radio waves with frequencies of 700 MHz to 1500 MHz), while allowing low-strength EM waves to pass with little attenuation. The gel material may include insulating polymers, such as poly (methyl methacrylate) (PMMA), Shin-Etsu silicone, silicone oil, or polydimethylsiloxane (PDMS). The gel material is a semi-solid host material which allows the conductive filler materials to mix inside the polymer matrix. The gel material may be a transparent liquid with high viscosity.

In some embodiments, the conductive filler material may include CNTs. The absorption effect of the protective layer comes from the interaction of CNTs in the gel material with incoming EM waves. Due to the fact that CNTs are highly conductive, CNTs are able to an generate electric current in response to an input EM wave. The CNTs may be exposed to the magnetic field from the earth. Therefore, under the Fleming's left hand rule, a force may be generated under the current and magnetic field.

As the input EM waves are applied to CNTs, an electric current is generated due to the highly conductive properties of CNTs. As a result, CNTs generate a force due to Fleming's left hand rule with a magnetic field presented at the same time. Although the magnetic field from the earth may be small, the electric current generated may be high due to the high electrical conductivity of CNTs. Therefore, a force can be generated, making CNTs move inside the gel material. The movement of CNTs may also be influenced by the gel viscosity, as discussed in more detail below.

CNTs may also generate Coulomb force (electrostatic force) due to current induced by exposure to EM waves due to Coulomb's law:

$$F = k\frac{q_1 q_2}{r^2}$$

Each carbon nanotube can be treated as a point charge (e.g. $q_1$, $q_2$), with adjacent CNTs (point charges) separated by a distance of r. Responsive to exposure to an EM wave, a force F is generated which makes the CNTs move within the gel material, changing their distribution. As a result, the CNTs serve to absorb the energy in the incoming EM wave.

Figure 2A:
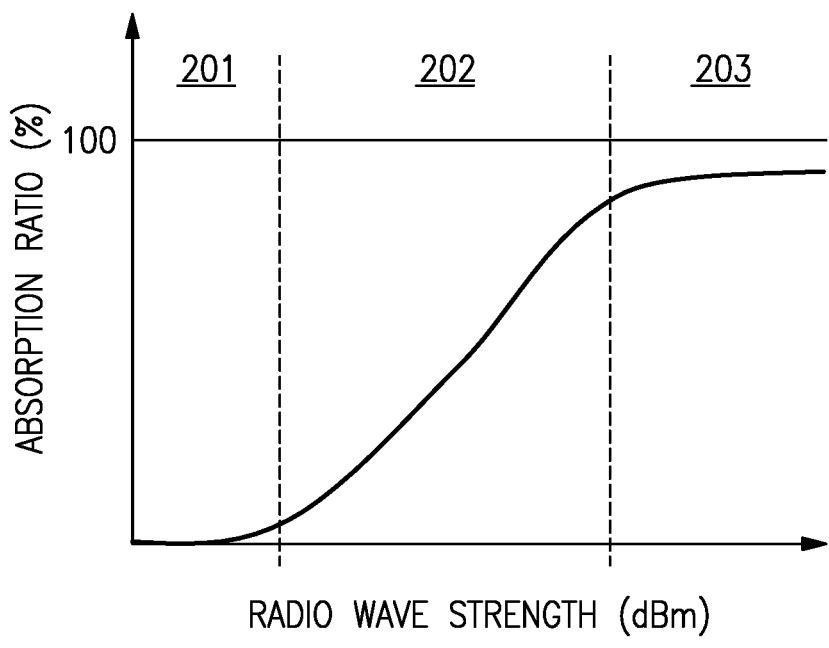
FIG. 2A is a graph showing the absorption mechanism of carbon nanotubes (CNTs) as a conductive filler material in a protective layer in response to different strengths of an incoming radio wave according to aspects and embodiments disclosed herein.
Figure 2B:
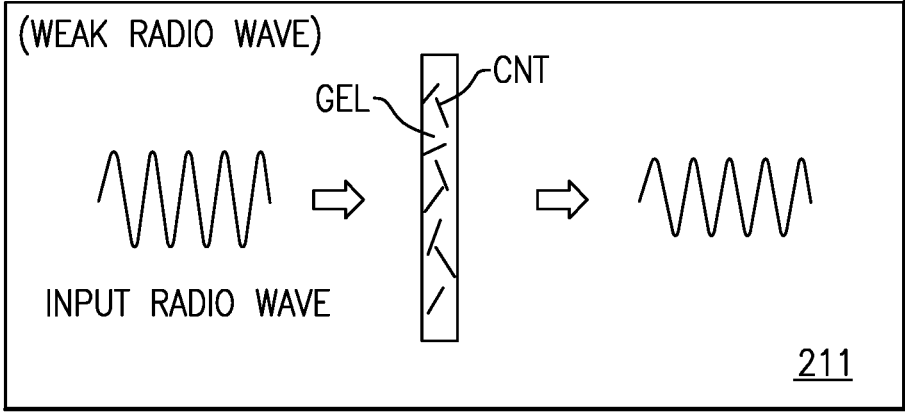
FIG. 2B are three graphs showing the schematic absorption mechanism of CNTs corresponding to FIG. 2A.
Figure 2B:
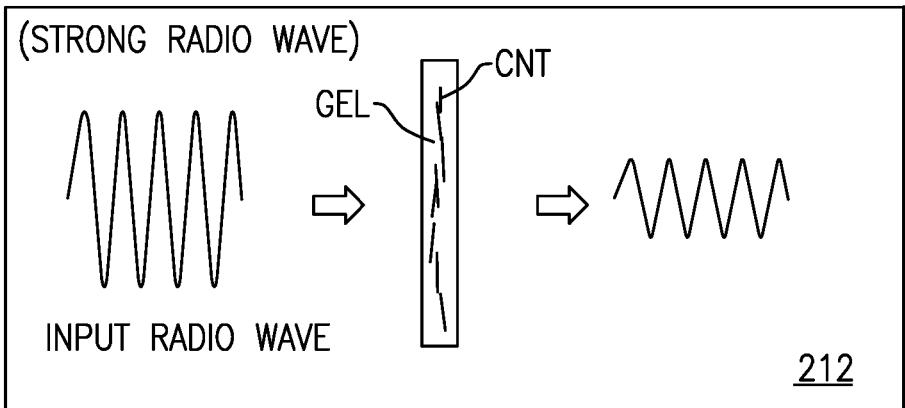
Figure 2B:
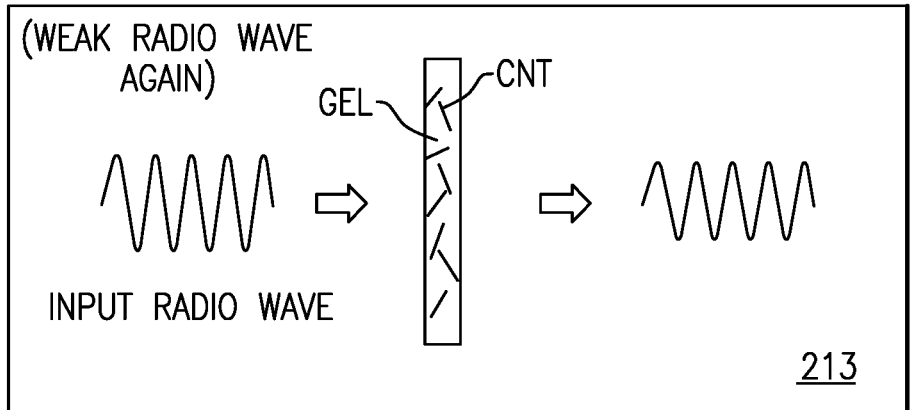

FIG. 2A shows that the absorption efficiency may vary with respect to the EM wave strength for radio frequency waves (herein after radio waves) in the range of 700 MHz to 1500 MHz input to the packaged SAW device. This range of frequencies is not intended to be limiting. FIG. 2B shows schematically the corresponding mechanism for absorption of radio wave energy by the CNTs. As discussed above, the absorption effect comes from the interaction of CNTs in the gel material with the incoming radio wave. The absorption effect is illustrated in FIG. 2A as an S-curve, which can be divided into three regions 201, 202, and 203, respectively. Region 201 represents an absorption response where a low-strength radio wave is applied. The low-strength input may not be sufficient to generate a significant electric current, accordingly, little force is generated for moving CNTs inside the gel material. Therefore, there is little attenuation of the incoming radio wave. Region 201 corresponds to the schematic diagram 211 in FIG. 2B where a weak radio wave is input. In diagram 211, the input radio wave passes through the layer formed by the gel with CNTs without significant attenuation.

Region 202 represents an absorption response where a gradual increase in wave strength is applied. The wave strength starts to generate electric current in the CNTs, and accordingly, a force is generated as well. CNTs inside the gel material tend to move slightly, giving rise to a certain amount of dissipation of the incoming radio wave. The extent of the dissipation of the incoming radio wave is reflected as the absorption ratio as shown in FIG. 2A. In region 202, as the input wave strength increases, the electric force generated in the CNTs and the associated current also increase. As a result, the absorption ratio of the incoming radio wave is proportional to the wave strength in region 202. Hence, region 202 is a transition region before reaching a maximum absorption ratio of CNTs in the gel material. Region 203 represents a region of maximum absorption effect where a higher strength radio wave is applied to the CNTs inside the gel material. In this region, a strong radio wave can drive movement of the CNTs inside the gel material. The CNTs tend to move more significantly and to align in an attempt to pass an electric current, giving rise to a large amount of attenuation of the input wave. Region 203 corresponds to the schematic diagram 212 in FIG. 2B where a strong radio wave is input. In diagram 212, the input radio wave is weakened significantly after passing through the layer formed by the gel with CNTs. In some embodiments in which a low-strength radio wave is applied after a high-strength radio wave, the CNT fillers may return to their original positions in the gel material due to the gel elasticity and viscosity. Hence, the attenuation amount may be low again. This corresponds to schematic diagram 213 where a weak radio wave is applied after a strong wave as shown in diagram 212. This mechanism may allow adjustment in strength of the incoming radio wave, which may shield at least part of a strong incoming radio wave and allow a weak radio wave to pass through without significant attenuation. The use of CNTs in the gel material for forming a protective layer may prevent the SAW device from damaging or breaking down due to exposure to a strong incoming electromagnetic wave.

Figure 3:
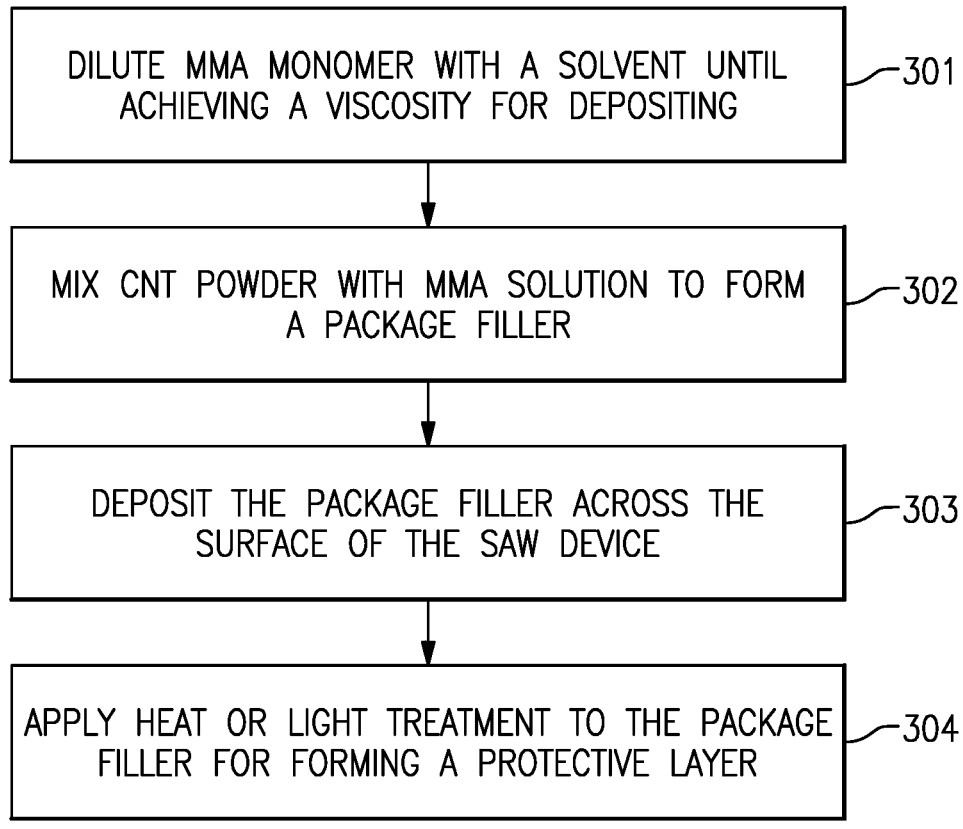
FIG. 3 is a flow chart of a process for manufacturing a protective layer for a SAW device according to aspects and embodiments disclosed herein.

FIG. 3 shows a flow chart of an embodiment of a process for manufacturing a package filler for a SAW device. The package filler is used to form a protective layer for the SAW device including a gel material and a conductive filler material. In some embodiments, the gel material is PMMA and the conductive filler includes CNTs. The process of manufacturing the package filler begins at step 301 where methyl methacrylate (MMA) monomer, the precursor of PMMA, may be diluted by adding solution (e.g., toluene or chloroform) until the MMA solution exhibits a viscosity at which it is easily deposited. A 10-15 vol % MMA solution may be utilized to adapt to various coating or printing processes. In some embodiments, 100% MMA liquid with CNTs may be used. The gel material may be PMMA, Shin-Etsu silicone, silicone oil, or PDMS. A volume ratio of the gel material precursor to solvent solution may be 100% when using Shin-Etsu silicone, or 10% to 15% when using diluted MMA solution.

The manufacturing process proceeds to step 302 where the CNTs are integrated into the gel material for forming a package filler. The CNTs in powder form may be mixed into the gel material by any form of mixer. The concentration of CNTs in the package filler may be selected to be within an optimized range. A low concentration of CNTs may be preferable, in a range of 0.0001 to 0.1 mg/ml. The concentration of CNTs may not be very high but still produce a strong electromagnetic wave shielding effect, substantially reducing the strength of an input radio wave to a packaged SAW device. The CNTs may have a diameter around 0.4 to 50 nm and a length around 1 to 10 μm. In some embodiments, multi-walled CNTs (MWCNTs) may be utilized. However, single-walled CNTs (SWCNTs) may also be used.

At step 303, the prepared package filler is deposited across the surface of the insulation layer of the packaged SAW device. The deposition method utilized may be spin-coating, inkjet printing, direct dispensing, etc. The deposition method may depend on the viscosity of the prepared package filler. In some embodiments, the package filler may be deposited by spin-coating. The speed of rotation of a package for spin-coating may be 1,000 to 3,000 rpm. The time duration for spin-coating may be 10 to 20 seconds.

After depositing, the process moves to step 304 where the MMA monomer in the package filler may be polymerized and hardened to PMMA by applying heat or light. Any heating process may be applied to the deposited package filler. In some embodiments, PMMA in the deposited package filler may be heated until a desired viscosity is achieved to form a protective layer. The viscosity of PMMA may be in a range of 700 to 2,000 cps during the coating or inkjet printing process and may be in a range of 10,000 to 20,000 cps after heat or light processing. The resultant thickness of the protective layer may be 15-30 μm.

Figure 4:
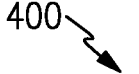
FIG. 4 is a cross-sectional view side of a SAW device enclosed in a protective packaging layer according to aspects and embodiments disclosed herein.
Figure 4:
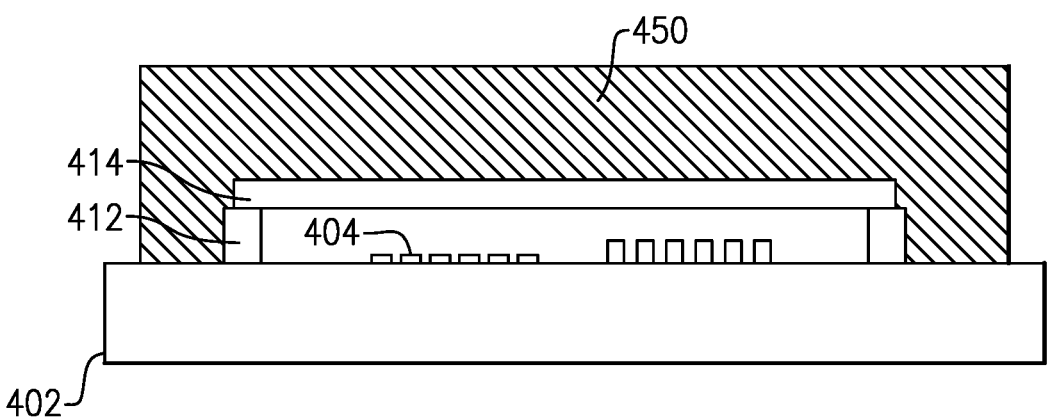

FIG. 4 shows a cross-sectional view of a SAW device 400 enclosed in a package comprising the protective layer of an embodiment disclosed herein. The protective layer 450 may be deposited on the outer surface of a cavity formed by a cavity roof 414 and cavity side walls 412. The cavity forms a space to cover the functional units of the SAW device, such as interdigital electrodes (IDTs) 404, and other electrical structures. The protective layer 450 may be deposited across at least on the top surface of the cavity roof 414. The protective layer 450 may also be deposited at the side areas extending from the cavity side walls 412. The viscosity of the protective layer 450 may be selected to avoid the leakage or flowing out of the gel material. In some embodiments, the protective layer 450 may be deposited directly on the surface of the functional units of the electronic components. For example, the protective layer 450 may be deposited directly on the IDTs. In such embodiments, it may be desired to lower the viscosity of the protective layer 450 to avoid any interference with the vibration of the IDTs. The gel material of the protective layer 450 may also be selected to provide greater insulating properties. A seal layer may be used to cover the protective layer if the viscosity of the protective layer is low to avoid the flow of the protective layer. An embodiment of the seal layer is described in further detail below.

Figure 5:
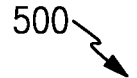
FIG. 5 is a cross-sectional view side of a SAW device enclosed in a protective packaging layer based on the structure of FIG. 1 according to aspects and embodiments disclosed herein.
Figure 5:
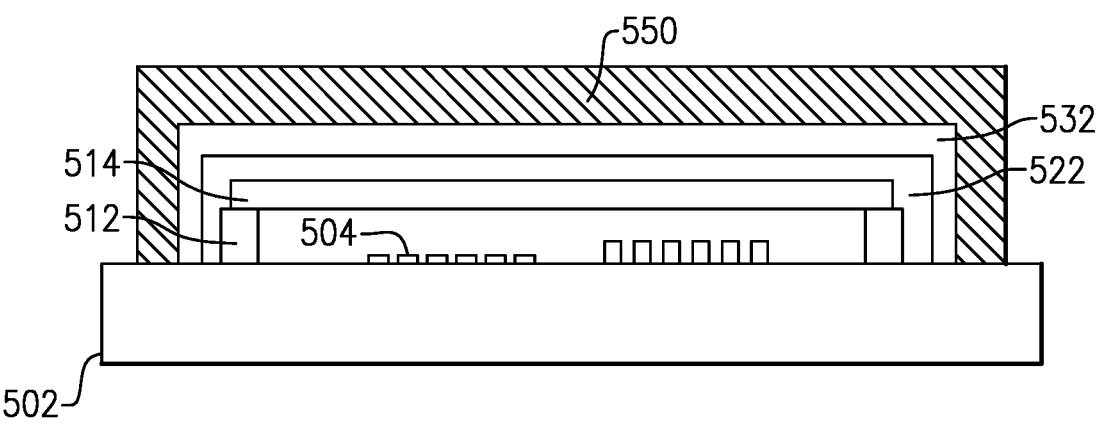

In another embodiment, shown in FIG. 5, the protective layer 550 may be deposited on top of a multi-layer packaged SAW device 500 based on the structure shown in FIG. 1. For example, the protective layer may be deposited on an insulation layer 532 which is disposed on a conductive layer 522 as shown in FIG. 5. In some embodiments, the packaging structure may include the conductive layer 522, but may not include the insulation layer 532. Therefore, the protective layer 550 may be deposited directly on the conductive layer 522. In this embodiment, the gel material of the protective layer 550 may be selected to provide sufficient insulating properties to function as an insulating layer, in addition to the radio wave strength adjusting function.

Figure 6A:
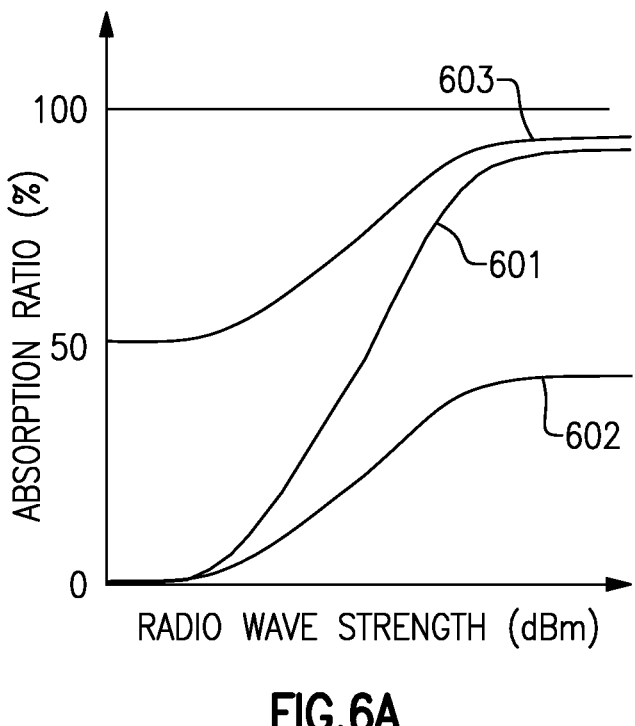
FIG. 6A is a graph showing absorption characteristics of a protective layer with respect to varying radio wave strength for three different concentrations of CNTs according to aspects and embodiments disclosed herein.

FIG. 6A shows a graph of the absorption characteristics of the protective layer with respect to varying radio wave strength for three different concentrations of CNTs 601, 602 and 603. The length of the CNTs in the protective layers corresponding to curves 601, 602, and 603 may be the same. A wide range of CNT concentrations may be covered by curves 601 to 603. Curve 601 shows absorption characteristics of CNTs with a concentration range of 0.0001 to 0.1 mg/ml. The absorption characteristics in curve 601 show a wide range of absorption ratio from 0% to near 100% to achieve an absorption (shielding) effect to a wide range of incoming radio wave strengths, as shown in FIG. 6A. At low wave strengths, the absorption ratio is very low which allows weak signal waves to pass through the protective layer. As for high wave strengths, the absorption ratio is high which reduces the input strength significantly before passing through the SAW device. The absorption characteristics in curve 601 serves functions for both adjusting or attenuating input waves and protecting the SAW device.

Curve 602 shows an absorption response by a protective layer including CNTs with a lower concentration than in the protective layer corresponding to curve 601. The range of the absorption ratio is narrow in comparison to the curve 601 with respect to the radio wave strength varying from low to high. The protective layer with the lower concentration of CNTs has little absorption effect for low-strength waves. The absorption ratio increases slowly with respect to an increase in wave strength. A maximum absorption ratio around only 40% can be achieved under very high-strength waves for curve 602. This absorption property may still be used for protection against low to moderate strength radio waves, however, may not be effective for protection against very high strength radio waves.

Curve 603 shows an absorption response of a protective layer including CNTs with a higher concentration that in the protective layer associated with curve 601. The high concentration CNTs in the gel material exhibit a high absorption ratio around 50% even when the input wave strength is very low. The range of absorption ratio is also narrow with respect to the radio wave strength varying from low to high. This absorption property may still be used for protection against very high strength radio waves, however, it may not be effective for passing low-strength radio wave signals which may be blocked completely.

By selecting a concentration of CNTs that results in a protective layer having radio wave absorption characteristics corresponding to curve 601, the protective layer can be implemented as a filter to attenuate radio waves that have a strength that is higher than a desired value. In other words, as can be seen from FIG. 6A, curve 601 has a region for low radio wave strengths, where there is substantially no absorption, a region for high radio strengths where there is high absorption, and an intermediate region in which the absorption ratio increases. A protective layer having a concentration of CNTs that results in the protective layer having radio wave absorption characteristics corresponding to curve 601 therefore acts as a low pass filter according to the radio wave strength. Thus, the device can be protected from high strength radio waves with little or no attenuation of lower strength radio waves. Thus, the concentration of CNTs that results in a protective layer having radio wave absorption characteristics corresponding to curve 601 may be preferred, though in other implementations the different responses indicated by curves 602 and 603 may be desirable. As explained in connection with FIG. 2B above, it will be appreciated that the absorption ratio curves may vary as a function of the CNT concentration and the viscosity of the material in which the CNTs are disposed.

Figure 6B:
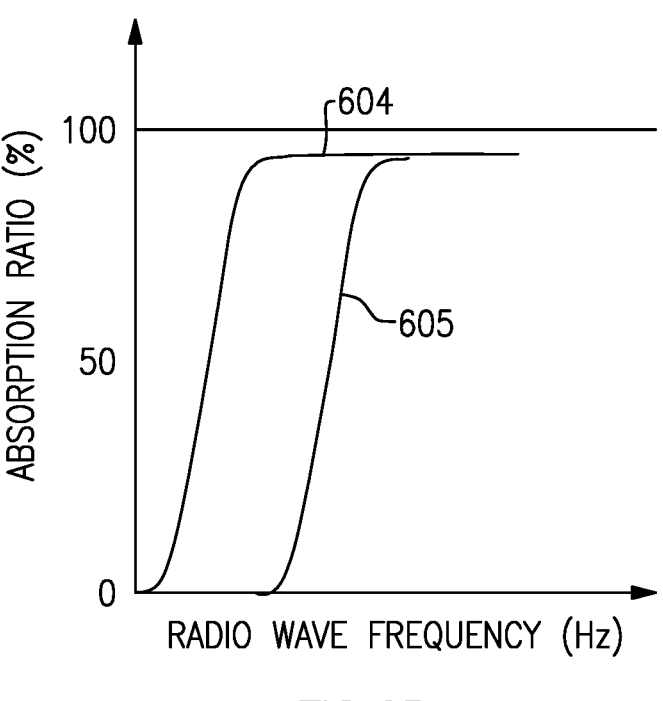
FIG. 6B is a graph showing absorption characteristics of a protective layer with respect to varying radio wave strength for different lengths of CNTs according to aspects and embodiments disclosed herein.

FIG. 6B shows a graph of other absorption characteristics with respect to varying radio wave frequencies for protective layers with two different lengths of CNTs, curve 604 corresponding to a protective layer with longer CNTs and curve 605 corresponding to a protective layer with shorter CNTs, respectively. The concentration of CNTs in the protective layers corresponding to curves 604 and 605 may be the same. Curve 604 shows absorption characteristics of long-length CNTs with respect to frequency changes. The length of the CNTs in the protective layer corresponding to curve 604 may be 1 to 10 μm. Curve 605 shows absorption characteristics of a protective layer having CNTs with shorter lengths than the CNTs of the protective layer associated with curve 604 with respect to frequency changes. Curve 604 shows that short-length CNTs may not have sensitive interaction in response to the incoming radio wave until a considerably high frequency is input. This indicates that short-length CNTs may only be efficient for protecting packaged SAW devices from very high frequency radio waves.

In some embodiments, the packaged SAW device may further comprise a seal layer formed over the outer surfaces of the protective layer. The seal layer may be configured to cover the exposed areas of the protective layer to seal the protective layer within the packaging of the SAW device. The material of the seal layer may be a photosensitive resin. The package filler may be deposited on one or more surfaces of the SAW device, including the top and bottom surfaces.

Figure 7:
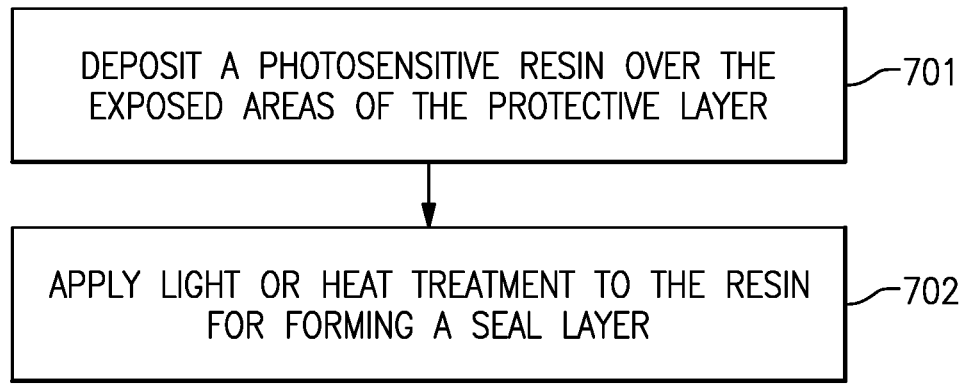
FIG. 7 is a flow chart of a process for manufacturing a seal layer for a SAW device according to aspects and embodiments disclosed herein.

FIG. 7 shows a flow chart of an embodiment of a process for manufacturing a seal layer for a packaged SAW device. The seal layer material may be photosensitive resin which is easy to deposit. The manufacturing process includes two main steps 701 and 702. At step 701, the photosensitive resin may be deposited over the exposed areas of the protective layer formed by depositing the package filler as in steps 303 and 304 of the flowchart of FIG. 3. The deposition method may include spin coating, inkjet printing, direct dispensing, or any similar deposition method. After depositing the seal layer material, at step 702, the seal layer material is solidified by exposure to heat or light. The heat or light treatment to solidify the seal layer material may be different from the heat or light treatment to solidify the protective layer at step 304 of the flowchart of FIG. 3 to not influence the protective layer when the seal layer material is solidified. The thickness of the seal layer may be around 10 to 30 μm.

Figure 8:
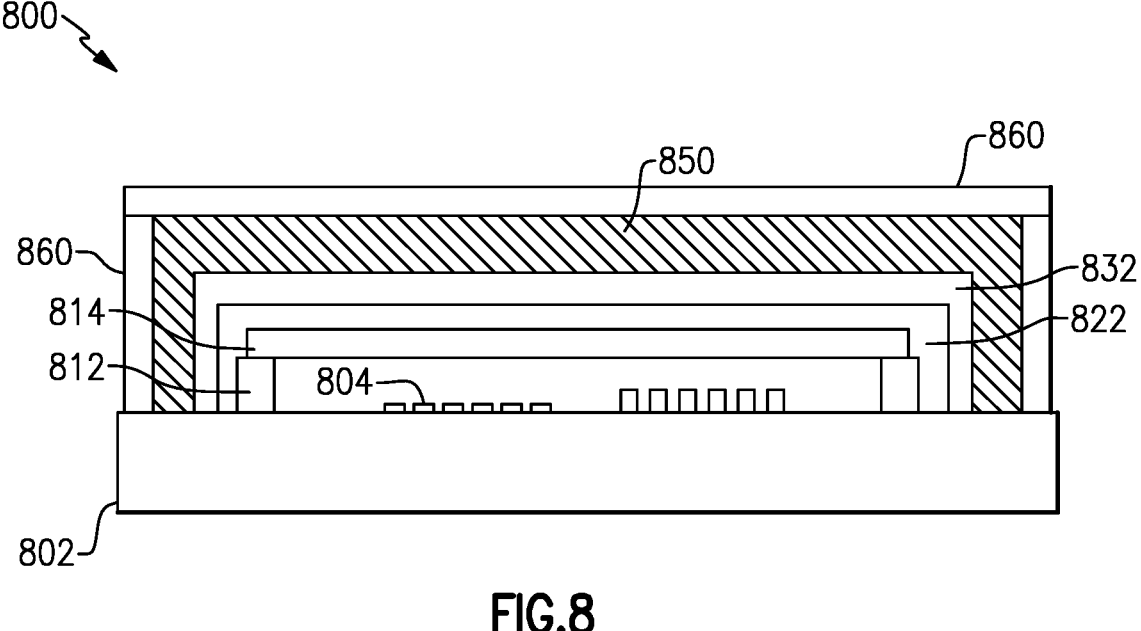
FIG. 8 is a cross-sectional view of a SAW device enclosed in a protective packaging layer and a seal layer based on the structure of FIG. 1 according to aspects and embodiments disclosed herein.

FIG. 8 shows a cross-sectional view of an embodiment of a packaged SAW device 800 comprising a protective layer and a seal layer. A seal layer may be added on top of the protective layer of the packaging structure illustrated in FIG.

5. The seal layer 860 may be deposited across at least the top surface of the protective layer 850. The seal layer 860 may also be deposited at the side areas extending from the protective layer 850.

Figures 9A, 9B, 9C:
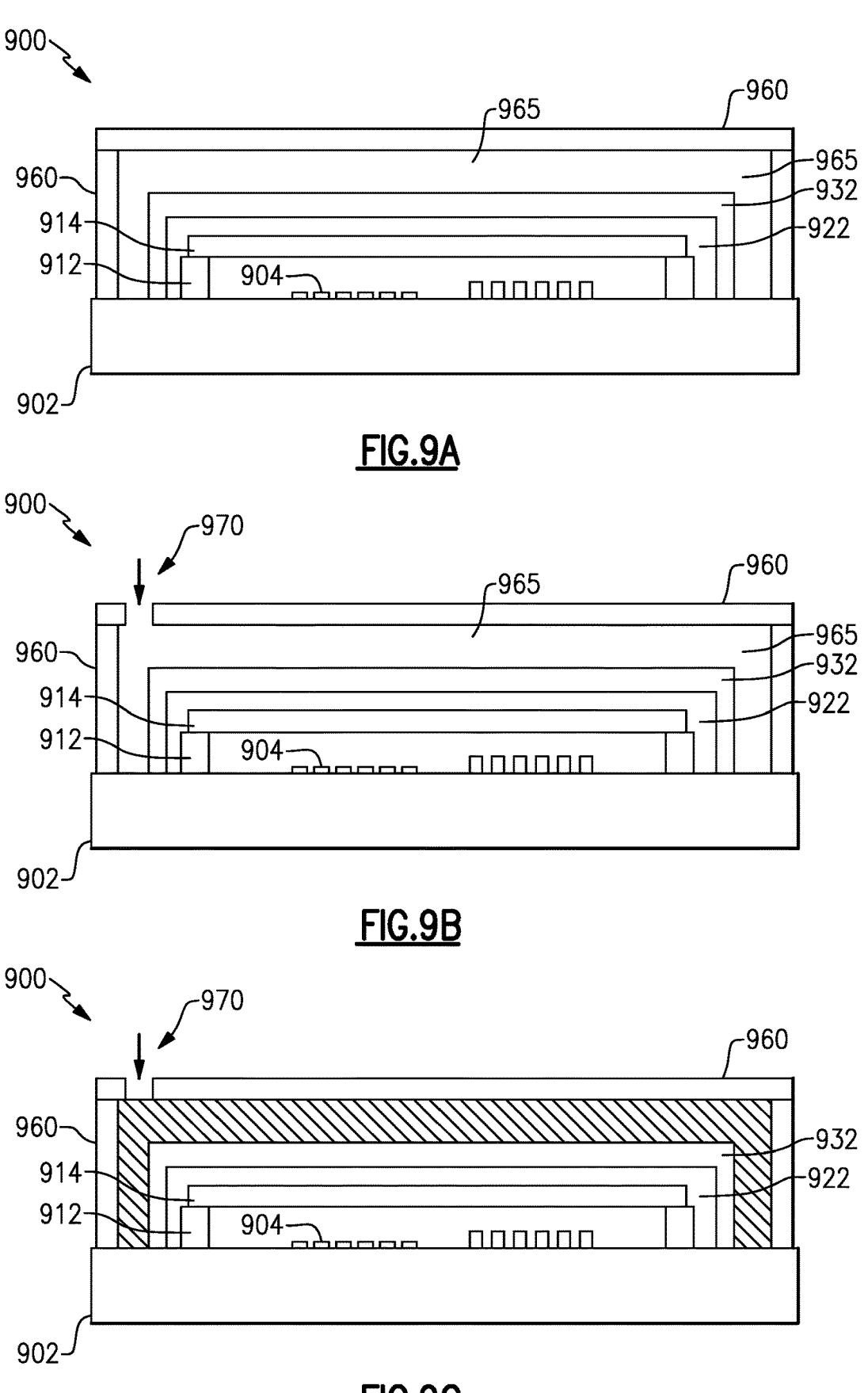
FIG. 9A to 9C show a manufacturing process for depositing a seal layer and a protective layer for a SAW device according to aspects and embodiments disclosed herein.

FIG. 9A to 9C show cross-sectional views of a packaged SAW device 900 comprising a protective layer and a seal layer according to an alternative embodiment. The SAW device includes IDTs 904 disposed on a substrate 902 and enclosed in a cavity defined by cavity sidewalls 912 and cavity roof 914. A seal layer 960 may be deposited first on the SAW device 900 before adding a protective layer. As shown in FIG. 9A, the seal layer 960 is deposited across at least the top surface of the enclosed SAW device 900, leaving a gap 965 between the deposited seal layer 960 and the outer surface of an insulation layer 932. The seal layer 960 may also be deposited at the side areas extending from the insulation layer 932, also leaving a gap 965 between the deposited seal layer 960 and the outer surface of the insulation layer 932. In FIG. 9B, an aperture or an opening 970 is created by light treatment of the photosensitive resin of the seal layer 960. This is followed by a step shown in FIG. 9C where a deposition method such as direct injection by a syringe with a small nozzle may be used to inject a package filler into the gaps 965 between the seal layer 960 and the insulation layer 932 through the aperture 970.

Figure 10A:
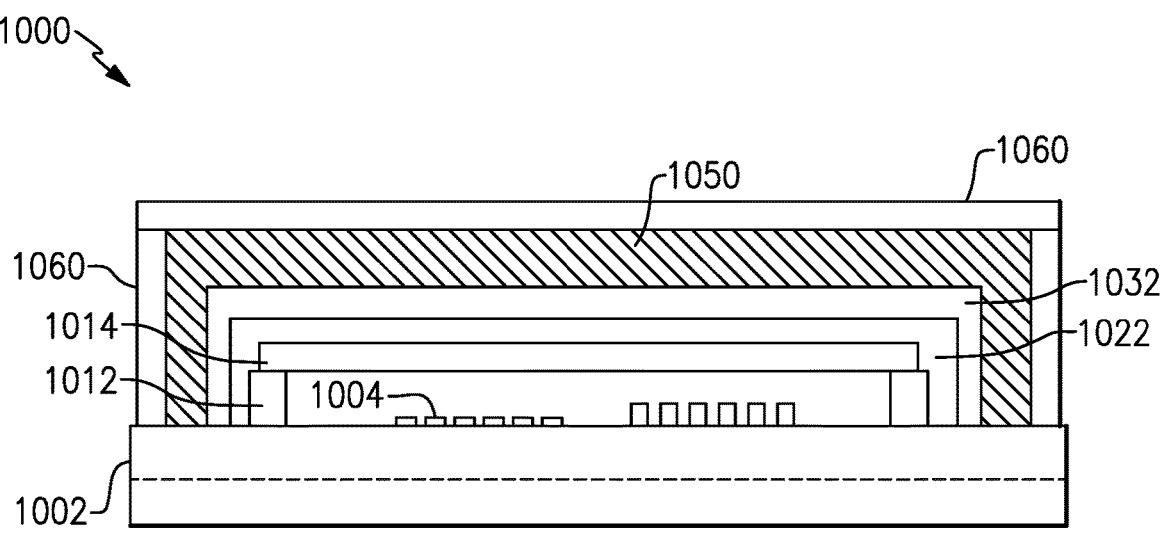
FIGS. 10A to 10D are cross-sectional views of a packaged SAW device at various stages of a manufacturing process at the rear side of the device according to aspects and embodiments disclosed herein.
Figure 10B:
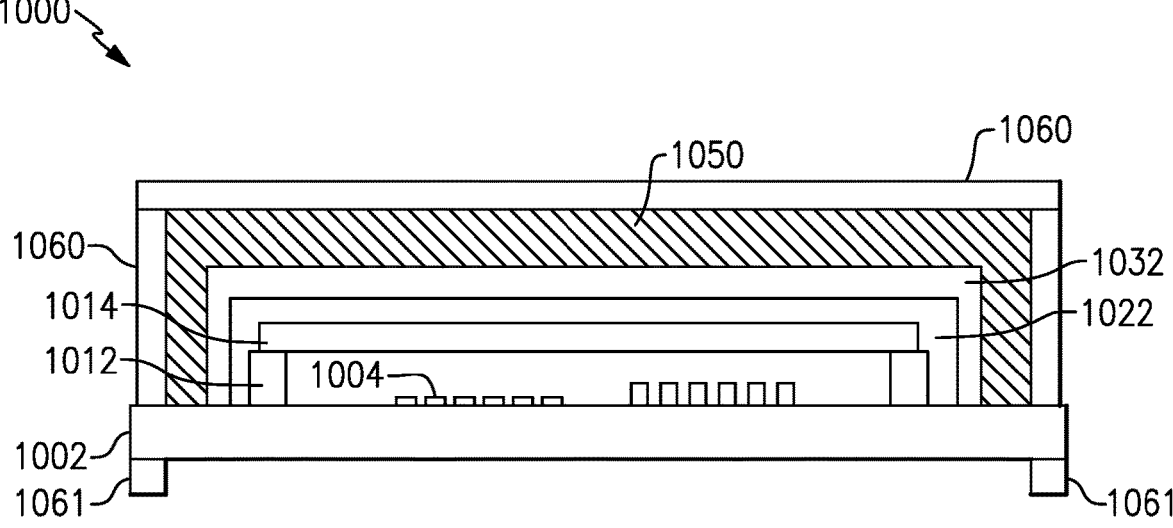
Figure 10C:
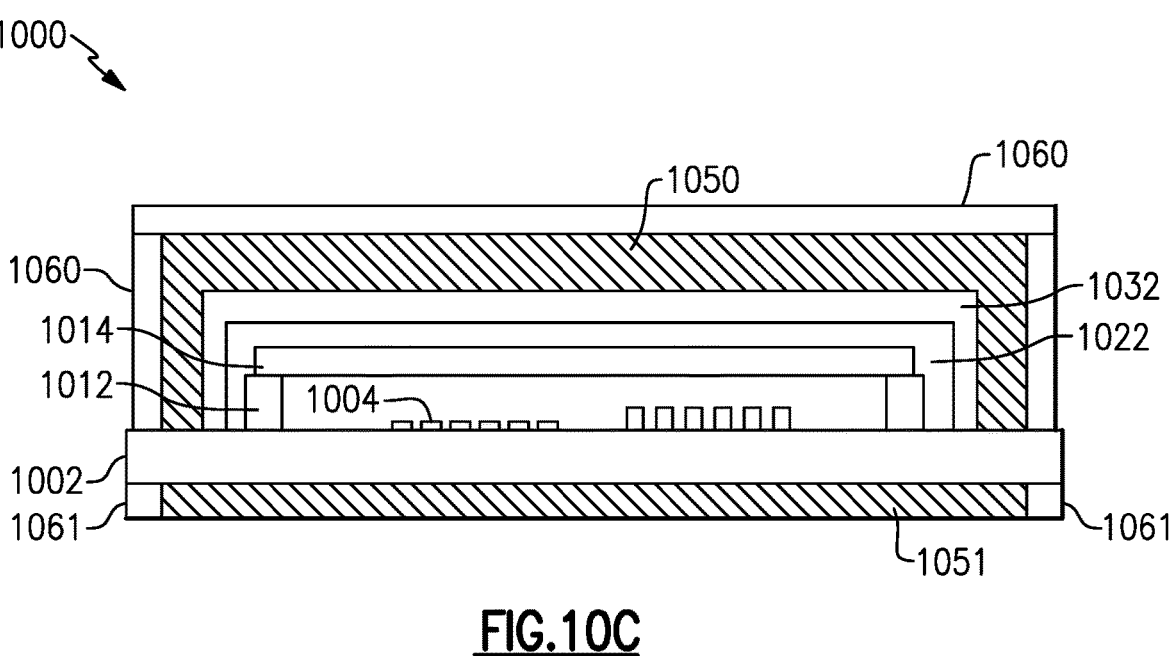
Figure 10D:
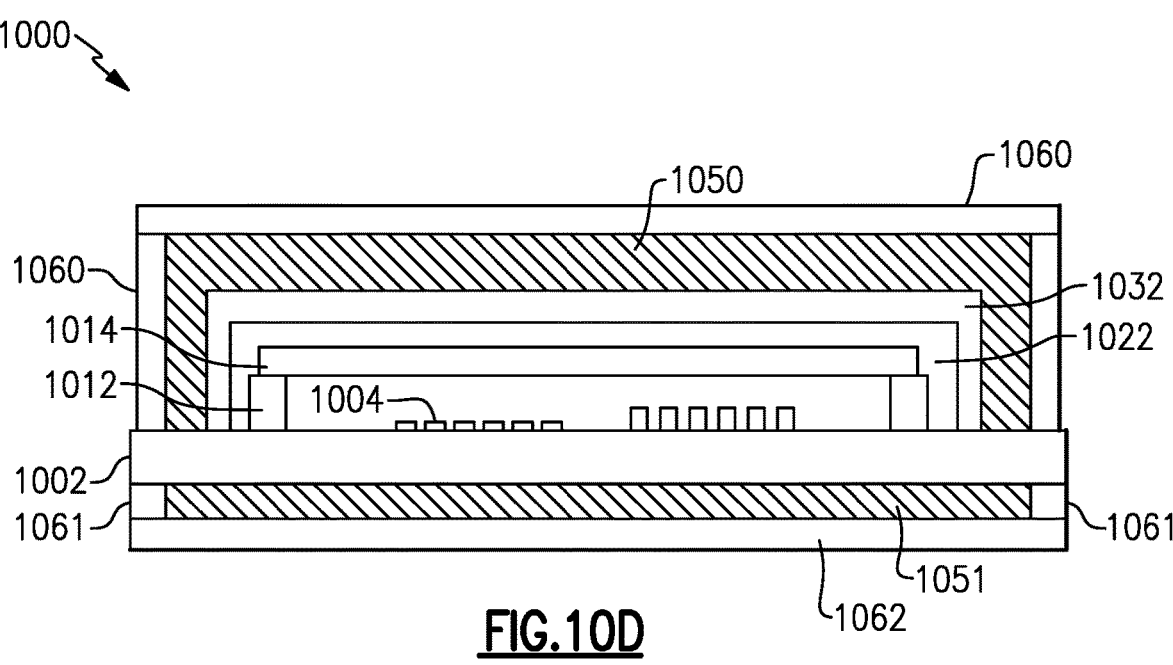

FIGS. 10A to 10D show cross-sectional views of a packaged SAW device 1000 also comprising packaging layers at the rear side of the device according to an alternative embodiment. As shown in FIG. 10A, the thickness of the die 1002 may be reduced significantly before further processing. Similar process may be repeated as embodiments shown in FIGS. 5 and 8. In FIG. 10B, seal layers 1061 are deposited at each end of the rear side of the die 1002. In FIG. 10C, a protective layer 1051 is deposited across the back surface of the die 1002. In FIG. 10D, a second seal layer 1062 is added to cover the surface area of the protective layer 1051. The packaged SAW device 1000 may further include chip marking at the rear side of the substrate of the SAW device 1000. In some embodiments, the gel material of the protective layer and the resin of the seal layer may be transparent when being deposited at the rear side of the SAW device 1000 to make the chip marking be visible.

Figure 11A:
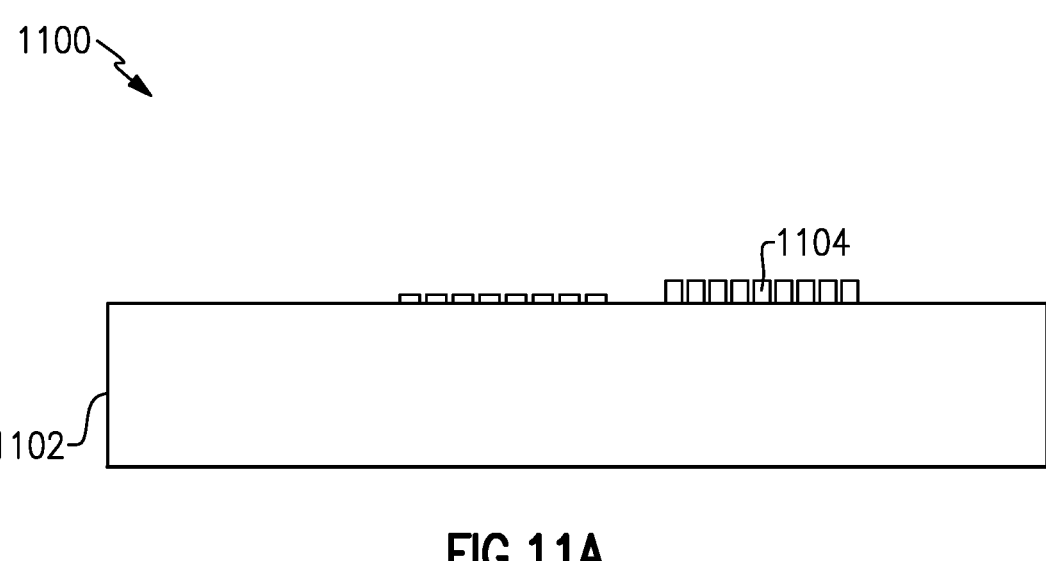
FIGS. 11A to 11H are cross-sectional views stages of an embodiment of a packaged SAW device assembly at various stages of manufacturing.
Figure 11B:
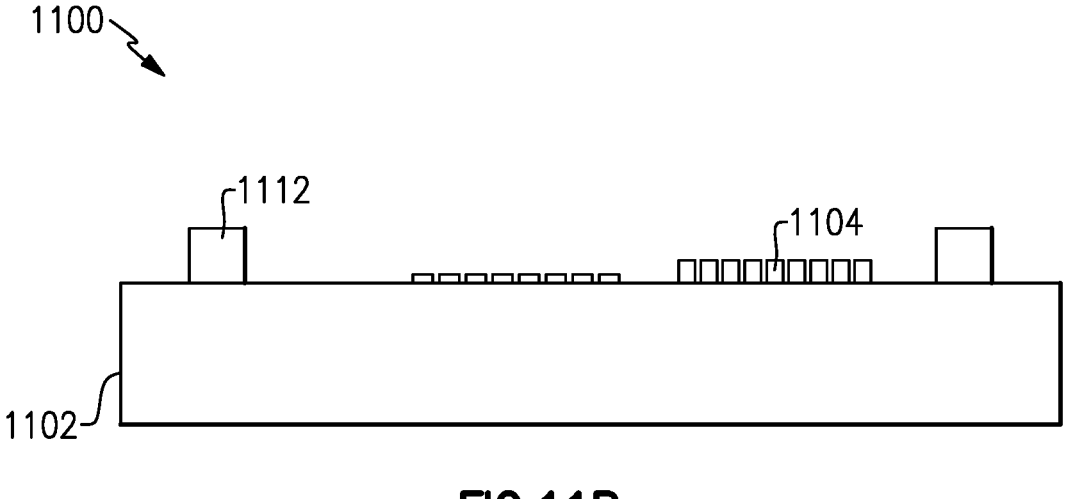
Figures 11C, 11D:
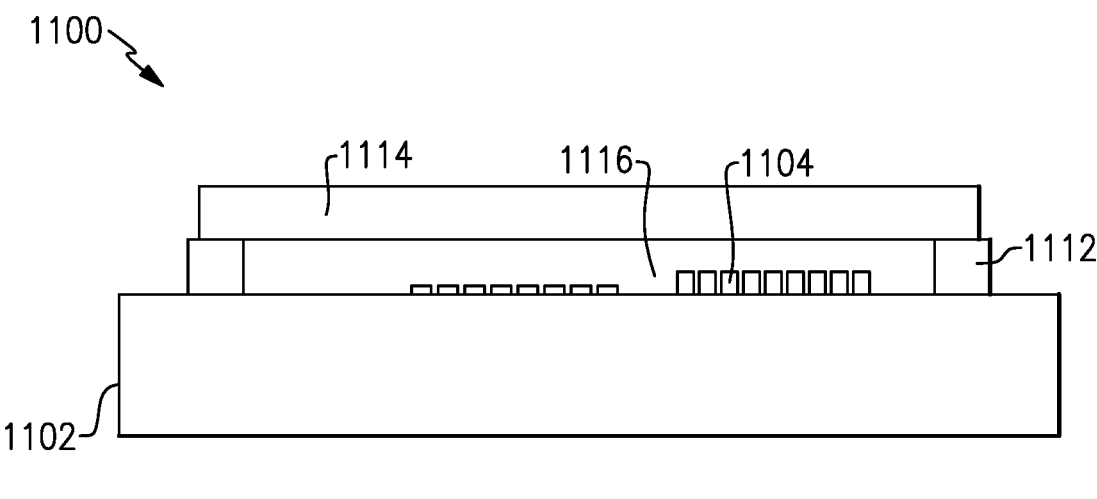
Figure 11E:
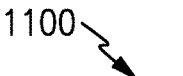
Figure 11E:
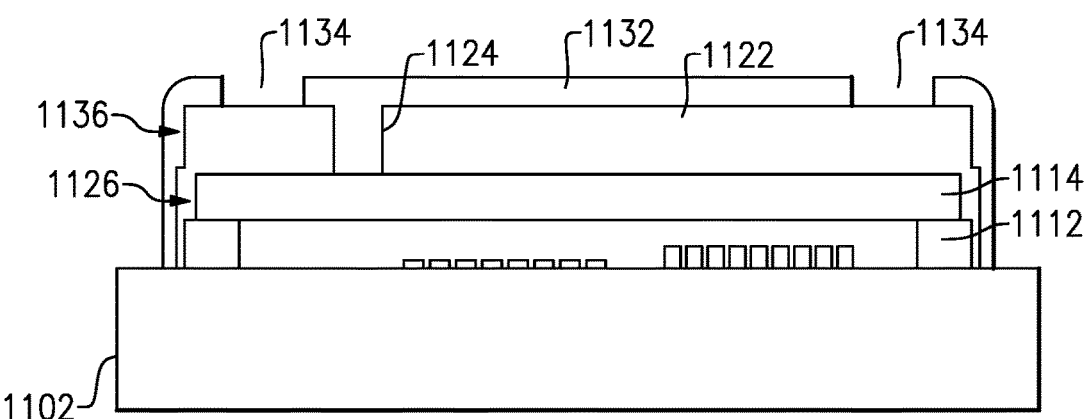

FIGS. 11A to 11G show cross-sectional views of an embodiment of a packaged SAW device 1100 at various stages of manufacturing. In FIG. 11A, the SAW device 1100 includes a die 1102 and IDTs 1104 on the die 1102. In FIGS. 11B and 11C, the IDTs are disposed within a cavity 1116. The sides of the cavity 1116 are formed by cavity walls 1112, and the roof of the cavity 1116 is formed by a cavity roof 1114 supported by the cavity walls 1112 and extending over the IDTs 1104. A conductive layer 1122 is then formed covering the cavity roof 1114. As shown in FIGS. 11D, a gap 1124 is defined in the conductive layer 1122 between two portions of the conductive layer 1122. The conductive layer 1122 also includes a sidewall portion 1126 extending along the side of the cavity roof 1114 and the cavity walls 1112 and extending down to the die 1102. The conductive layer 1122 can contact interconnect structures such as electronic traces on the die 1102, allowing electrical communication with the IDTs 1104. In FIG. 11E, an insulation layer 1132 extends over outer surfaces of the conductive layer 1122 and fills the gap 1124 in the conductive layer 1122. Side portions 1136 of the insulation layer 1132 extend down the sides of the conductive layer 1122 to the die 1102.

The insulation layer 1132 may be a photosensitive buffer coat layer. In some embodiments, negative-type photosensitive material can be used as the photosensitive buffer coat layer. The insulation layer 1132 may include a phenol resin with rubber filler. The insulation layer 1132 can be patterned by selectively exposing the photosensitive layer to illumination and subsequently removing soluble portions of the photosensitive layer. Removal of portions of the insulation layer 1132 exposes the underlying conductive layer 1122, which includes apertures 1134 for contacting terminals for external connections as shown in FIG. 11E.

Figure 11F:
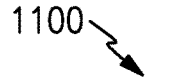
Figure 11F:
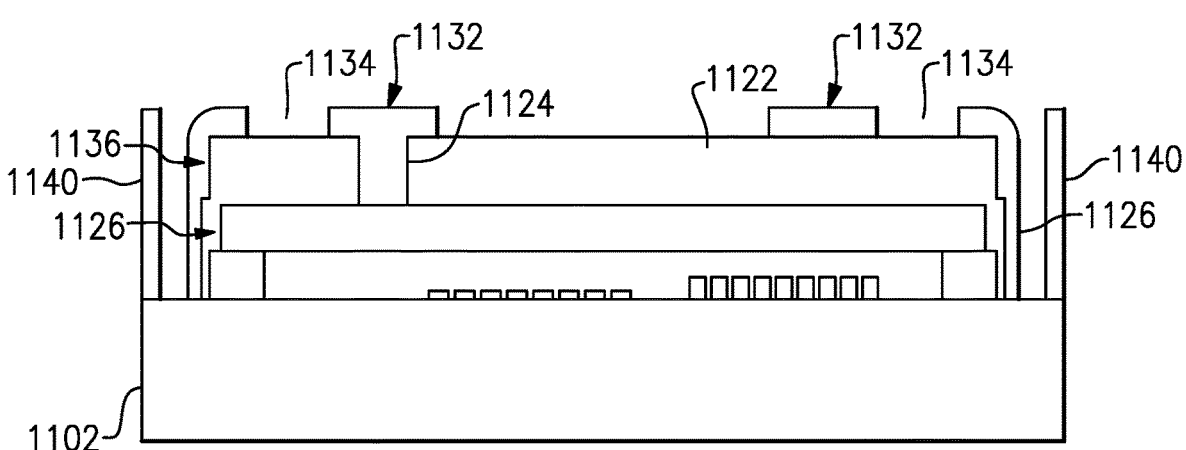
Figure 11G:
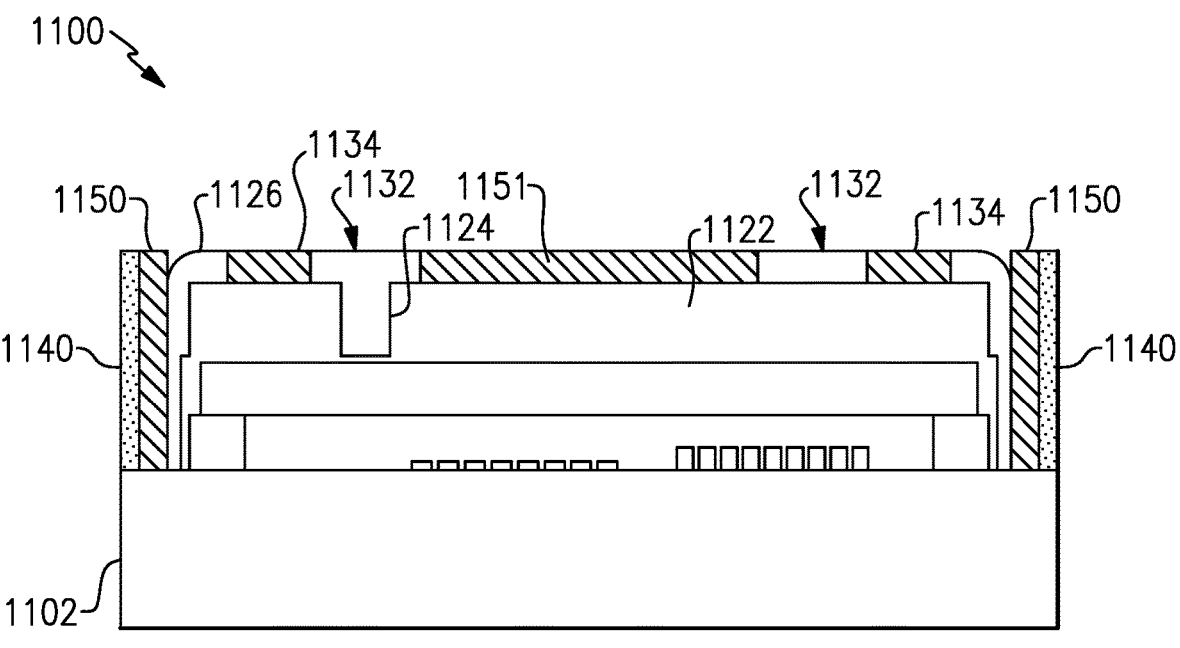

As shown in FIG. 11F, seal layers 1140 are deposited on each side of the side portions of the insulation layer 1126. A gap may be left between seal layers 1140 and the adjacent outer surface of insulation layers 1136 to fill in package fillers for forming protective layers at each side. As shown in FIG. 11G, protective layers 1150 and 1151 may be configured to replace at least part of the insulation layer 1132 on the SAW device 1100 and extend along the side of the cavity walls 1112, and down to the die 1102.

Figure 11H:
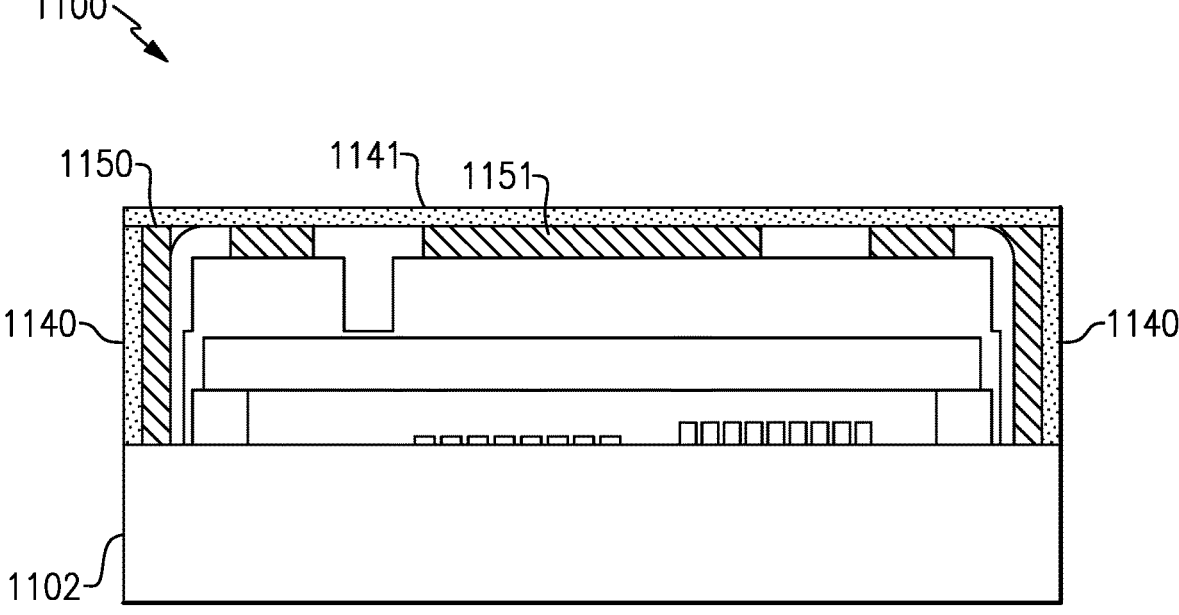

FIG. 11H shows a second seal layer 1141 added on top of the deposited protective layer 1151 at a horizontal side of the SAW device 1100 to cover the exposed portions of the protective layer 1151. An injection syringe with small nozzles may be used to inject the package filler material inside a gap between the seal layer 1141 and the insulation layer 1132 at an aperture or an opening created in the seal layer 1141.

Figure 12A:
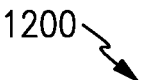
FIGS. 12A and 12B are cross-sectional views an embodiment of a packaged SAW device assembly at various stages of manufacturing.
Figure 12A:
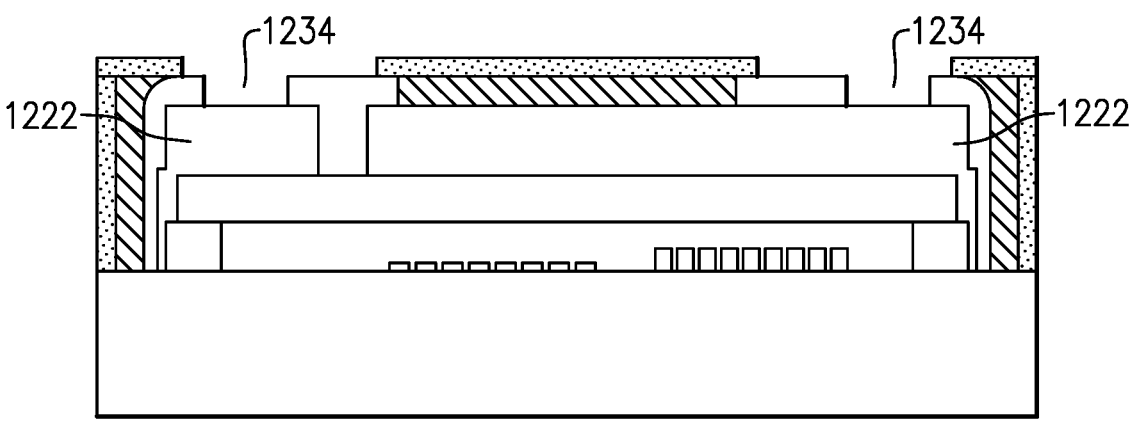
Figure 12B:
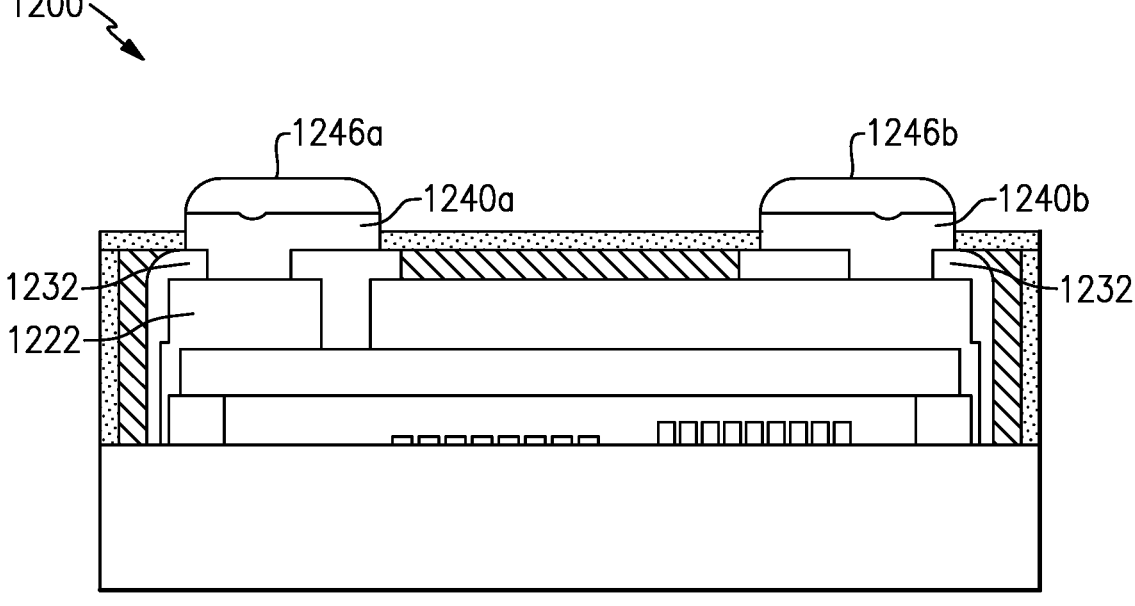

In some embodiments, a packaged SAW device may further include terminals located above respective portions of the conductive layer and in physical contact with the conductive layer through apertures in the insulation layer. FIGS. 12A and 12B show cross-sectional views of an embodiment of a packaged SAW device 1200 at various stages of manufacturing. FIG. 12A shows that the areas across the apertures 1234 exposing underlying sections of the conductive layer 1222 are left uncovered by removal of some portions of the photosensitive resin and the protective layer. In FIG. 12B, terminals 1240a and 1240b are formed overlying the apertures 1234 in the insulation layers 1232. In some embodiments, the terminals 1240a and 1240b may include copper or another suitable conductive material. Solder portions 1246a and 1246b are then formed over the upper surfaces of terminals 1240a and 1240b, respectively. The solder may include tin in some embodiments, although other suitable solder material may be used as well. The solder portions 1246a and 1246b may facilitate bonding of the terminals 1240a and 1240b to external devices, making connections through the conductive layer 1222 with the SAW device within the cavity.

Figure 13A:
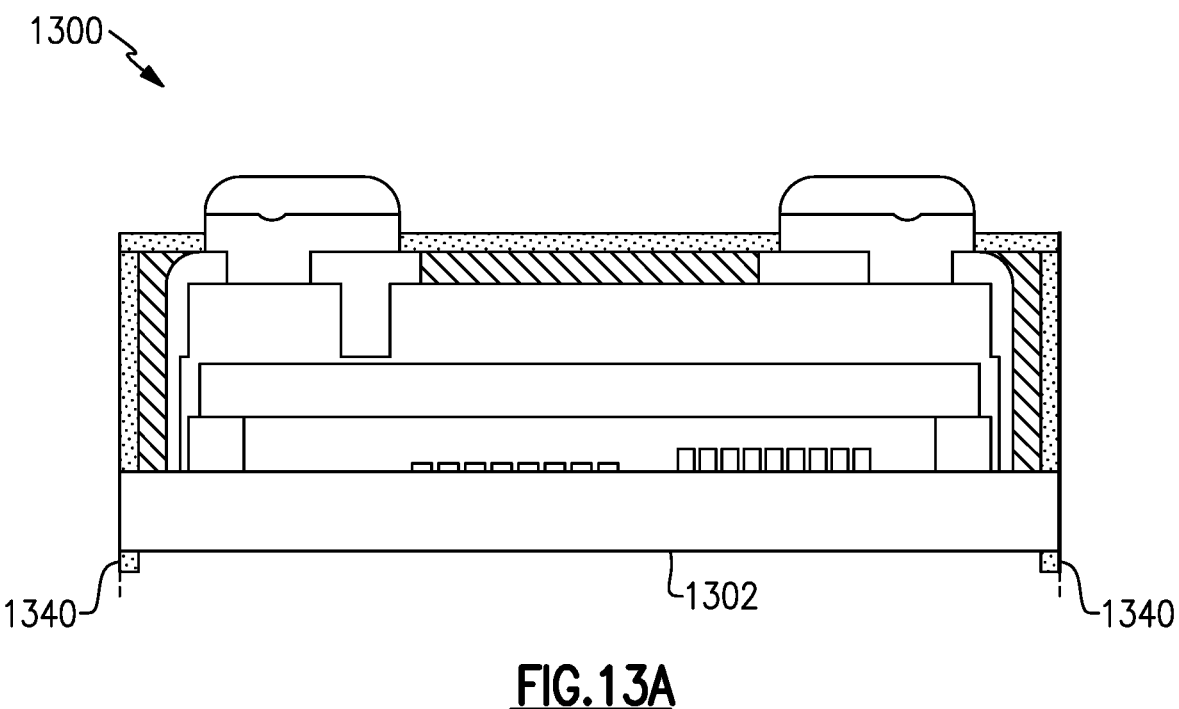
FIGS. 13A to 13C are cross-sectional views an embodiment of a packaged SAW device assembly at various stages of manufacturing.
Figure 13B:
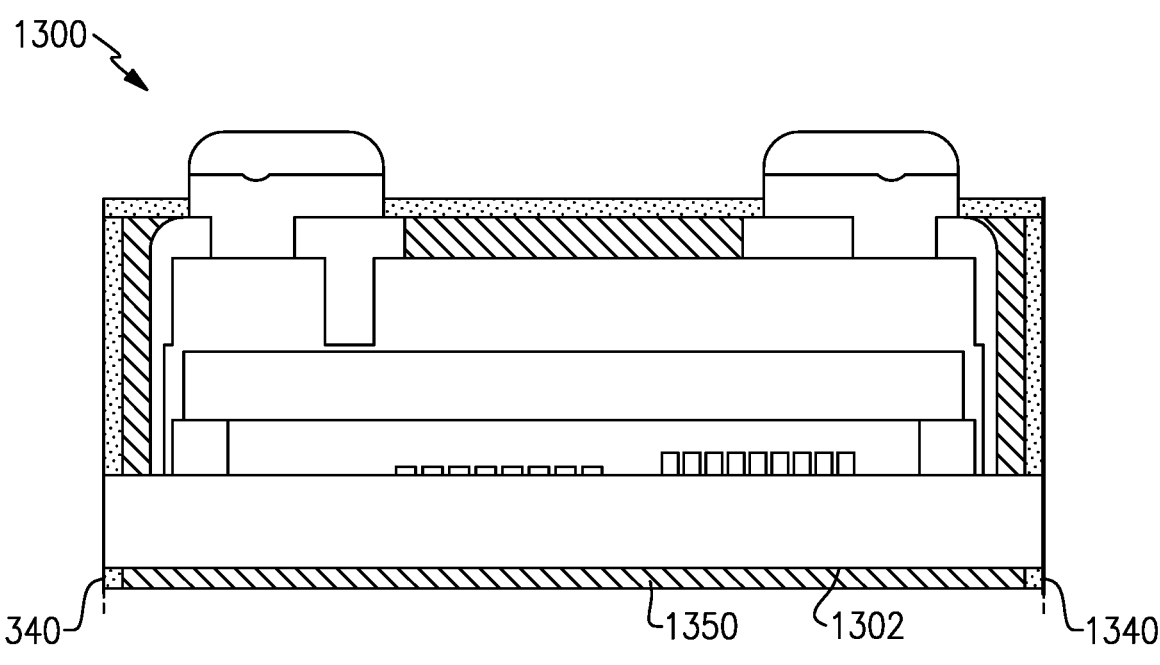
Figure 13C:
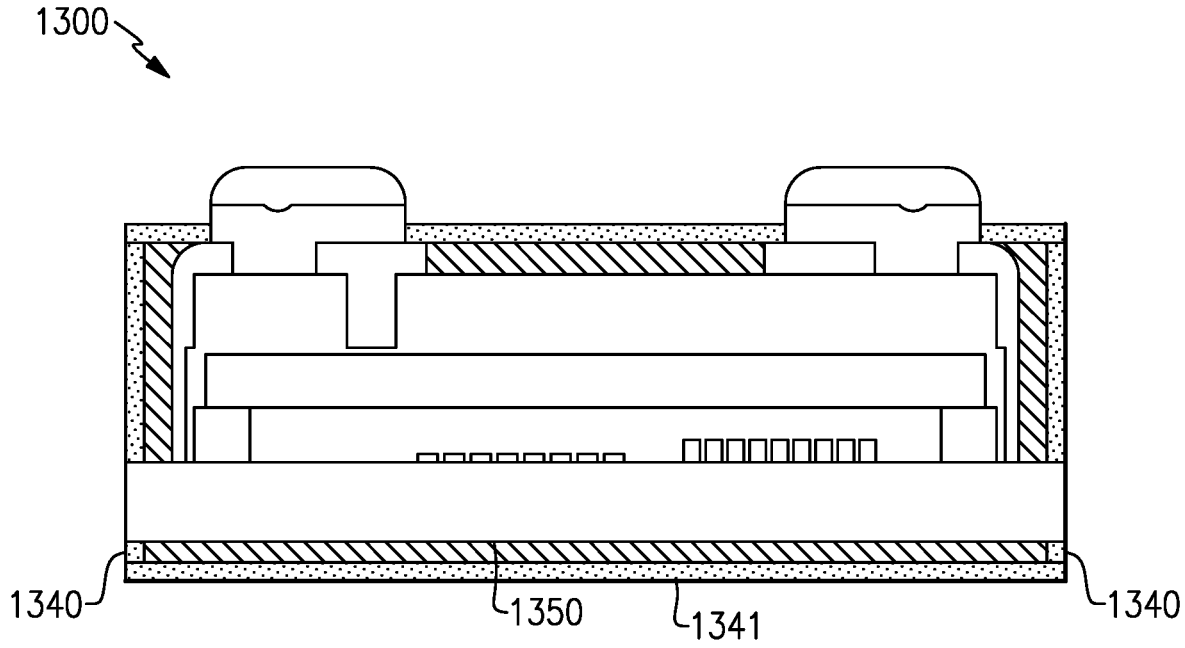

FIGS. 13A to 13C show cross-sectional views of an embodiment of a packaged SAW 1300 device at various stages of manufacturing. As shown in FIG. 13A, seal layers 1340 are deposited at each end of the rear side of the die 1302. In FIG. 13B, a protective layer 1350 is deposited across the back surface of the die 1302. In FIG. 13C, a second seal layer 1341 is added to cover the surface area of the protective layer 1350. The packaged SAW device 1300 may further include chip marking at the rear side of the substrate of the SAW device 1300. In some embodiments, the gel material of the protective layer and the resin of the seal layer may be transparent when being deposited at the rear side of the SAW device 1300 to make the chip marking visible.

Aspects of this disclosure can be implemented in various electronic components or electronic devices. Examples of the electronic devices can include, but are not limited to, consumer electronic products, parts of the consumer electronic products such as semiconductor die and/or packaged radio frequency modules, electronic test equipment, uplink wireless communication devices, personal area network communication devices, etc. Examples of the consumer electronic products can include, but are not limited to, a mobile phone such as a smart phone, a wearable computing device such as a smart watch or an ear piece, a telephone, a television, a computer monitor, a computer, a router, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. An electronic component enclosed in a protective packaging, the protective packaging comprising:

a gel material; and an electrically conductive filler material which is mixed into the gel material for formulating a package filler, the package filler being configured to form a protective layer over the electronic component for adjusting or attenuating at least part of an electromagnetic wave input to the electronic component according to input wave strength.

2. The electronic component enclosed in the protective packaging of claim 1 wherein the electronic component is a surface acoustic wave device.

3. The electronic component enclosed in the protective packaging of claim 2 wherein the surface acoustic wave device comprises a cavity enclosed by a cavity roof and cavity side walls.

4. The electronic component enclosed in the protective packaging of claim 3 wherein the surface acoustic wave device comprises:

a conductive layer on top of the cavity roof; and an insulating layer on an outer surface of the conductive layer.

5. The electronic component enclosed in the protective packaging of claim 1 wherein the filler material is one of carbon nanotubes (CNTs), graphene, or metal particles.

6. The electronic component enclosed in the protective packaging of claim 1 wherein the gel material is one of PMMA, silicone, silicone oil, or PDMS.

7. The electronic component enclosed in the protective packaging of claim 1 wherein the gel material is transparent.

8. The electronic component enclosed in the protective packaging of claim 1 wherein the protective packaging further comprises a seal layer configured to secure the protective layer on an outer surface of the protective layer.

9. The electronic component enclosed in the protective packaging of claim 8 wherein the seal layer is one of photosensitive resin, acrylic, or epoxy resin.

10. The electronic component enclosed in the packaging of claim 8 wherein the seal layer is solidified by heat or light treatment after depositing.

11. The electronic component enclosed in the protective packaging of claim 1 wherein a concentration of the electrically conductive filler material is in a range of 0.0001 to 0.1 mg/ml.

12. The electronic component enclosed in the packaging of claim 1 wherein the gel material is diluted by a solvent before depositing.

13. The electronic component enclosed in the packaging of claim 1 wherein the package filler is formed by one of spin coating, inkjet printing, or direct dispensing.

14. The electronic component enclosed in the packaging of claim 1 wherein viscosity of the package filler is within one of a range of 700 to 2,000 cps, or a range of 10,000 to 20,000 cps.

15. The electronic component enclosed in the packaging of claim 1 wherein the gel material of the package filler undergoes heat or light treatment after depositing.

16. The electronic component enclosed in the packaging of claim 1 wherein an operating frequency of the electronic component is between 700 MHz and 1500 MHz.

17. The electronic component enclosed in the packaging of claim 1 wherein an operating temperature of the electronic component is 0 to 70° C.

18. The electronic component enclosed in the packaging of claim 1 wherein the input electromagnetic wave is shielded by the package filler with a ratio of 0% to more than 80%, depending on the strength of the input electromagnetic wave.

19. A package filler for packaging an electronic component, comprising:

a gel material; and an electrically conductive filler material which is mixed into the gel material for forming a package filler, the package filler being configured to form a protective layer of the electronic component for attenuating at least part of an electromagnetic wave input to the electronic component according to input wave strength.

20. The package filler for packaging an electronic component of claim 19 wherein the electronic component is a surface acoustic wave device.

* * * * *